United States Patent [19]

Reinberg et al.

[11] Patent Number: 5,358,908
[45] Date of Patent: Oct. 25, 1994

[54] METHOD OF CREATING SHARP POINTS AND OTHER FEATURES ON THE SURFACE OF A SEMICONDUCTOR SUBSTRATE

[75] Inventors: Alan R. Reinberg, Westport, Conn.;
Howard E. Rhodes, Boise, Id.

[73] Assignee: Micron Technology, Inc., Boise, Id.

[21] Appl. No.: 837,833

[22] Filed: Feb. 14, 1992

[51] Int. Cl.$^5$ .......................... H01L 21/465
[52] U.S. Cl. ..................... 437/228; 437/153;
437/157; 437/986; 156/628; 156/643; 156/648
[58] Field of Search ................ 445/45–50;
313/309, 310, 313, 346; 437/228, 203, 59,
69–73, 986, 947, 153, 157, 148, 225, 249;
156/643, 644, 645, 628, 646, 648, 655, 659.1;
148/DIG. 168

[56] References Cited

U.S. PATENT DOCUMENTS

| | | | |
|---|---|---|---|
| 4,372,033 | 2/1983 | Chiao | 437/70 |
| 4,419,811 | 12/1983 | Rice | 29/571 |
| 4,857,478 | 8/1989 | Niwano et al. | 437/69 |
| 5,104,517 | 4/1992 | Scott | 437/51 |

OTHER PUBLICATIONS

Wolf, S. and R. Tauber, "Silicon Processing for the VLSI ERA" Lattice Press, Sunset Beach, Calif., vol. 1, 1986, pp. 531–532.

Primary Examiner—George Fourson
Assistant Examiner—D. Mason
Attorney, Agent, or Firm—Kevin D. Martin

[57] ABSTRACT

A method of producing sharp points on the surface of a substrate is described. The points are useful as field emitter tips, and may also be used to collect radiant energy and for the production of micromachined objects such as micron sized gears and levers. Conventional techniques of asperity fabrication typically use an undercut of a hard mask to etch away the substrate material. This conventional method is very time specific and difficult to control. The inventive process uses a more easily controlled etch than conventional asperity fabrication techniques. The inventive process begins with a substrate highly doped with a P-type dopant such as boron which prevents an etch with KOH or other material. A hard mask is patterned over the substrate surface, and an N-type dopant, such as phosphorous or arsenic, is implanted into the substrate surface. The N-type dopant diffuses under the hard mask at a rate more easily controlled than the etch used in conventional techniques. The N-type dopant counterdopes the boron implanted substrate, thereby making the substrate etchable. The mask is removed and the substrate is etched, thereby removing the counterdoped areas and leaving the P-doped areas, which includes the asperity.

22 Claims, 8 Drawing Sheets

METHOD OF CREATING SHARP POINTS AND OTHER FEATURES ON THE SURFACE OF A SEMICONDUCTOR SUBSTRATE

FIELD OF THE INVENTION

This invention relates to the field of semiconductor manufacture. More specifically, a method of creating sharp points (asperities) on the surface of a semiconductor substrate is described. This invention would be useful during the fabrication of field emitters for various electronic functions. The invention could also be useful in the collection of radiant energy, for example to improve the absorption of optical radiation in solar cells and energy collectors. In addition, it can be used in various micromachining applications such as the manufacture of micro-sized gears and levers.

BACKGROUND OF THE INVENTION

To manufacture a semiconductor device such as memory or logic, an electronic circuit is chemically and physically integrated into a substrate such as a silicon wafer by patterning regions in the substrate, and by patterning layers on the substrate. These regions and layers can be conductive for conductor and resistor fabrication and can also be of differing conductivity types, which is essential for transistor and diode fabrication. Degrees of resistance, capacitance, or conductivity are controllable, as are the physical dimensions and locations of the patterned regions and layers, making circuit integration possible.

In this disclosure, "N-type" denotes silicon that has been doped with atoms having more than four valence electrons (group V or higher) such as arsenic or phosphorus which introduce negatively charged majority carriers into the silicon, and "P-type" denotes silicon doped with atoms having less than four valence electrons (group III or lower) such as boron which introduce positively charged majority carriers. The majority charge carrier type is also referred to as conductivity type. "Poly" denotes polycrystalline silicon. By photomasking, geometries on the order of a micron or less are obtainable for device elements in the integrated circuit.

Several process steps are required to produce a functional semiconductor die. A wafer of a starting material such as silicon or gallium arsenide is layered with oxide, poly, nitride, photoresist, and other materials in various configurations, depending on the type and design of the device which is being produced. Each step may require the local deposition of one of the above listed materials (patterning), or a blanket layer of the material may be laid down and a pattern etched away with chemicals or abraded away by particles.

Features having sharp points or asperities 10 on the surface of a substrate 12, as shown in FIG. 1, are used as emitter tips in computer display screen technology. These tips 10 are usually formed by placing a mask 14 on the surface of the substrate 12, and wet or dry etching the substrate surface 12 to undercut the mask 14. A problem with this method of forming the asperities 10 is that the etch time greatly affects the sharpness and uniformity of the tip 10. FIG. 2 shows the results of four different etch times on an asperity. At time "1" the substrate is greatly underetched, and the asperity is nonexistent. At time "2" the asperity approaches the desired shape, but is still slightly underetched. Time "3" produces the desirable point of FIG. 1, while at time "4" the substrate is overetched and the tip is not as sharp. Furthermore, because the etch rate is not uniform across the substrate, it is at best exceedingly difficult to produce a plurality of emitters all having critically sharp characteristics which form simultaneously. U.S. Pat. No. 3,970,887 by Smith, et al., which is incorporated herein by reference, describes the manufacture of emitter tips.

SUMMARY OF THE INVENTION

An object of the invention is to provide a method of forming features on the surface of a semiconductor substrate, such as sharp asperities which can be used in the manufacture of flat panel displays, or microminiature gears and levers which can be used in the manufacture of micromachines.

Another object of the invention is to provide a method of forming features on the surface of a substrate which allows for better control over the etching of the substrate to produce more uniform features.

These objects of the invention are realized by using the etch rate differences in P-type doped silicon vs. undoped silicon to form features of a desired shape on the surface of a silicon substrate. Numerous other embodiments are also possible and likely to an artisan of skill in the art upon reviewing the information herein, such as using the etch rate differences of N-type doped substrate vs. undoped or P-type doped substrate. To simplify the information as disclosed, only the etching of a P-type doped substrate counterdoped with an N-type material to form a sharp asperity is described in detail.

It is known that the etch rate of silicon with mixtures containing KOH depends on the level of doping with boron, a P-type dopant, in the silicon. In a mixture containing approximately 63.3 Wt. % $H_2O$, 23.4 Wt. % KOH, and 13.3 Wt. % Isopropanol, the etch rate of silicon in the <100> crystallographic orientation containing an N-type dopant concentration of about $10^{14}$–$10^{18}$ boron/$cm^3$ is approximately 1.0 $\mu$m/minute. When the boron doping concentration is increased to greater than about $10^{19}$/$cm^3$–$10^{20}$ /$cm^3$, however, the etch rate is very low, approximately equal to zero.

The various embodiments of the inventive process described herein use this large variation in the etch rate to produce controlled shapes in monocrystalline and polycrystalline silicon or other workable materials. The method consists of creating a 3-dimensional variation in conductive P-type concentration using a P-type dopant. This document refers throughout to boron as the P-type dopant of choice, and phosphorous as the N-type dopant, but other dopants known in the art would also produce satisfactory results. Arsenic, phosphorous, and antimony are sufficient N-type dopants. The dopant of choice may vary depending on the geometry, i.e. deep sub-micron structures could require arsenic which has a lower diffusion coefficient. The area to be etched has various conductivities of P-type material. The area closest to the surface of the substrate has the lowest P-type conductivity, being near zero, and is easily etched away with a selected etchant. The P-type conductivity gradually increases deeper into the substrate, as the counterdoping material does not penetrate as effectively deeper into the boron-doped substrate. At a point deep in the substrate, the boron is not highly counterdoped by the N-type dopant, and the etching of the substrate is prevented.

Using this process, a large number of structures can be formed on the surface of a semiconductor substrate which have more uniform characteristics than structures manufactured by previous fabrication methods.

Detailed Description of the Invention

The embodiments of the inventive process as described below can produce different types of features on the surface of a semiconductor substrate. For most uses of the inventive process, a number of structures will be formed simultaneously.

The preferred embodiments of the invention use a substrate having a gradational concentration of boron. In regions where all of the substrate is to be removed, the boron is highly counterdoped by an N-type dopant, resulting in an area having a low P-type conductivity. Deeper into the substrate the boron is less counterdoped, thereby having a higher P-type conductivity. The P-type conductivity increases and becomes high enough to prevent the substrate from being etched. At least two embodiments of the inventive method are described below, and other variations may be evident to an artisan of skill in the art from the descriptions contained herein. The embodiments described herein show a process for manufacturing asperities. The process can also be used to manufacture other features such as gears and levers as used with micromachines, and the process for manufacturing the micromachine structures would be evident to one of skill in the art from the descriptions herein.

The implantation of boron into the substrate is a preferred step in the inventive method of producing a desired feature such as asperities or gears. A similar method which omits the P-type implant would provide a sufficient feature, however, and would be evident to one of skill in the art from the description herein. The boron provides an etch stop, and makes the process much less dependent on time factors during the etch step. Therefore, the method described below includes the preferred boron implant.

Figure 3A:
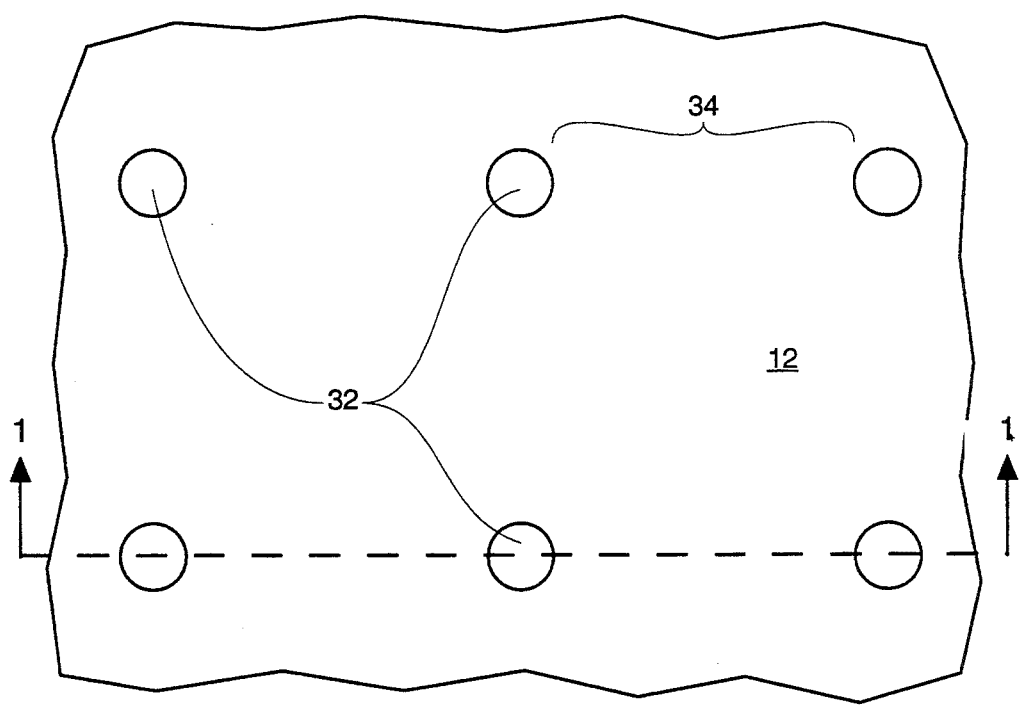
FIG. 3A is a top view.
Figure 3B:
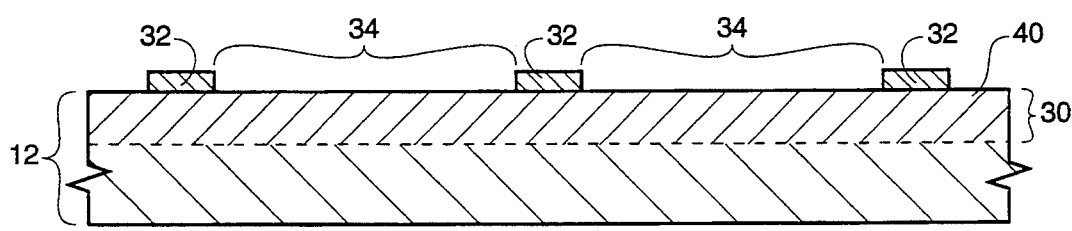
FIG. 3B is a cross section showing a first set of steps in a first embodiment of the inventive method of forming an asperity on the surface of a substrate, which includes boron doping and mask formation.

Referring to FIGS. 3A and 3B, a first step of a first embodiment of the inventive process as used to produce an asperity is to heavily dope a portion of the substrate 30 with boron at a concentration high enough to completely prevent etching throughout the doped area of the substrate 30. A concentration of boron over about $10^{19}$–$10^{20}$/cm$^3$ is usually sufficient, depending on the substrate material, dopant, and etchant. The substrate 12 is implanted with boron to this high concentration to a depth commensurate with the height of the desired feature.

Alternatively, an epitaxial layer of boron doped silicon can be grown on an N-type, or more likely P-type, substrate. The material in which the asperities are formed can be a layer of fine grained polycrystalline silicon which is deposited on a single-crystal substrate.

Next, a material 32 which acts as a barrier or mask to prevent the implantation of an N-type dopant into the substrate 12 is formed over the substrate 12 by photomasking or other workable methods. A layer such as photoresist, a patterned hard mask such as oxide or nitride, as well as other workable materials, would sufficiently prevent the implantation of N-type material into the substrate. The barriers 32 are separated by a distance commensurate with the desired feature separation. The barrier material 32 can have various diameters, depending on the desired sizes of the asperities. The spaces 34 between the areas of barrier material 32 allow for the passage of dopant material into the boron doped substrate 30, and are referred to in this embodiment as vias. The barriers shown are round and in a grid arrangement, although other shapes and arrangements are also possible and likely.

Figure 4:
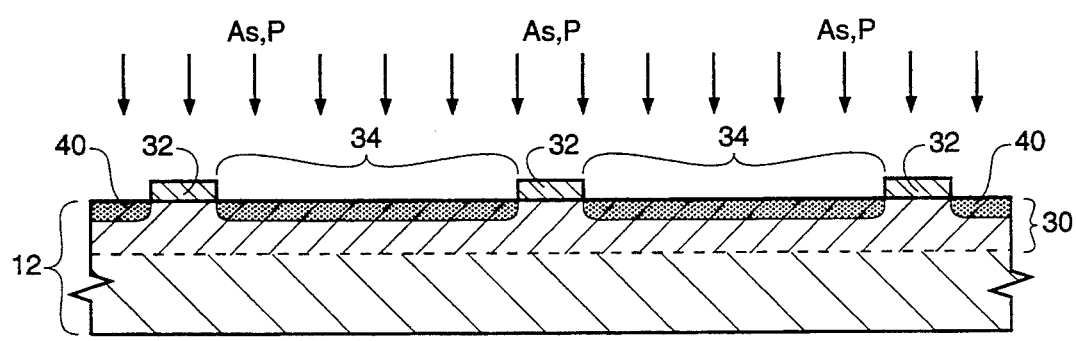
FIG. 4 is a cross section showing the implantation of an N-type material into the substrate.

After the barrier material 32 is patterned onto the substrate 12, areas 40 of the boron doped substrate 30 are counterdoped with an N-type dopant (such as phosphorous, arsenic, or other material as known in the art) as shown in FIG. 4. The regions of the substrate 40 counterdoped with the N-type dopant assume the shapes as shown. This N-type dopant suppresses the electrical activity of the boron, thereby making this counterdoped area 40 of the boron doped substrate 30 less conductive.

After the substrate 30 is counterdoped, the N-type material is diffused by means known in the art, such as by heat diffusion methods. The time and temperature of the diffusion is controlled so that the N-type material does not have time to completely penetrate into the substrate material 30 and equilibrate throughout; To the contrary, it is limited so that the counterdopant diffuses only part way into the boron doped substrate 30, thereby producing a three-dimensional gradient particularly in the region underneath the barrier 32.

Figure 5:
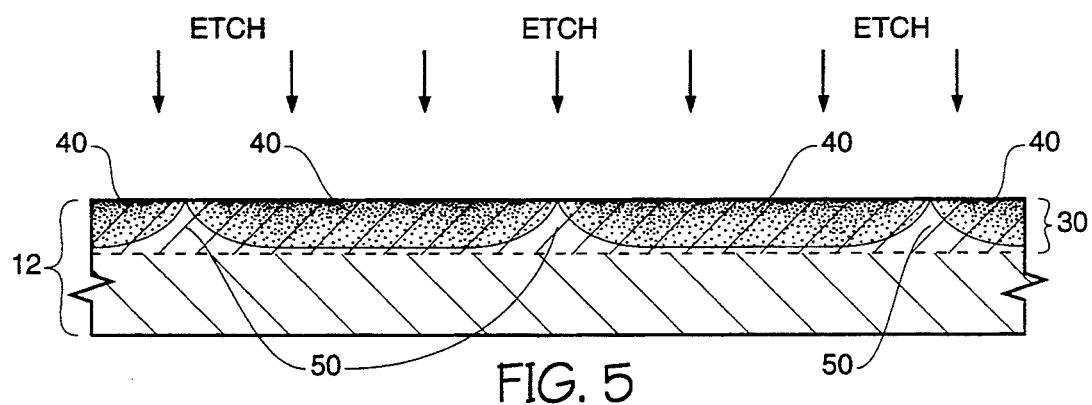
FIG. 5 is a cross section showing the substrate after diffusion of the N-type material, and after the etching away of the N-type implanted substrate material, which can be accomplished with or without the mask of FIG. 4 in place.

Referring to FIG. 5, the counterdoped substrate material 40 is etched away with an etching solution which selectively removes the material having a low P-type conductivity, but leaves material which has a high P-type conductivity. A solution containing KOH is an example of an etchant which would be sufficient. Other etchants could also be used such as a dry etch which is selective to N-type material, or an HF/HNO3 wet etch. In the instant case, where the etching is done with a KOH solution, a high P-type conductivity is greater than about $10^{19}$–$10^{20}$ boron/cm$^3$. Low active boron concentration is less than about $10^{13}$–$10^{14}$ boron/cm$^3$. Those substrate areas which have an active boron concentration of between about $10^{14}$–$10^{20}$ boron/cm$^3$ are somewhat etched, the rate of the etch depending on the conductivity of the substrate material.

Figure 6A:
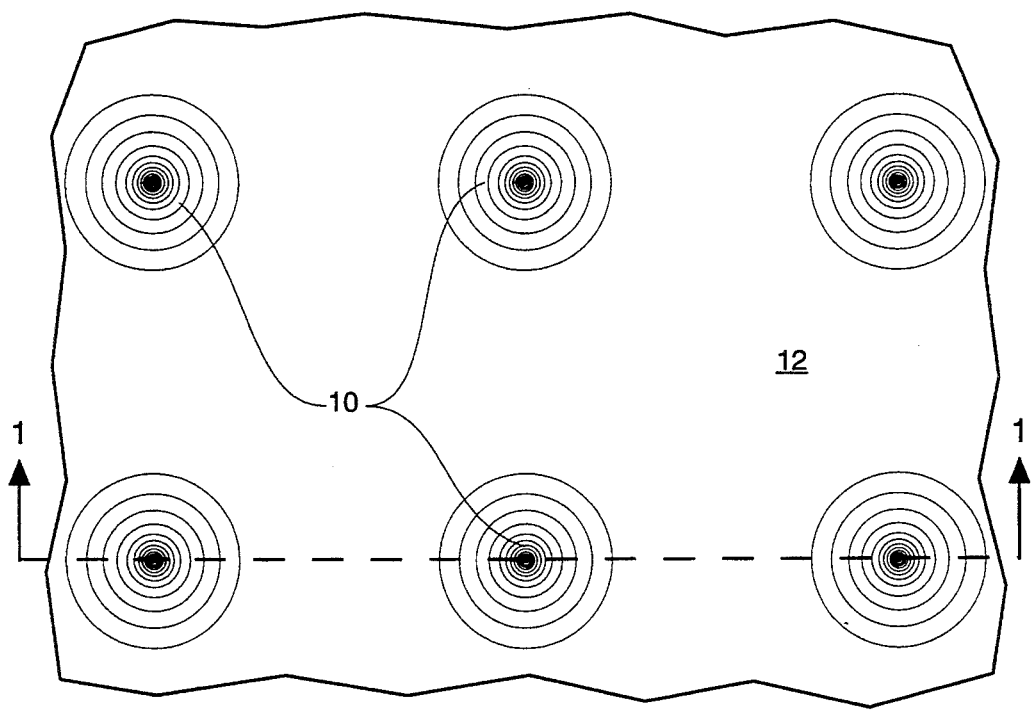
FIG. 6A is a top view.

The result of the inventive process as used in this instance is a plurality of sharp asperities. When viewed in cross section, the asperities appear between adjacent crater-like hollows 60 in the surface of the substrate 12 as shown in FIGS. 6A (top view) and 6B (cross section). These structures have applications as field emitters for various electronic functions. They also can allow for improved absorption of optical radiation in solar cells and energy collectors, and in various micromachining applications to produce micron sized gears and levers. Both of these uses would be evident and manufacturable to one of skill in the art.

Figure 7:
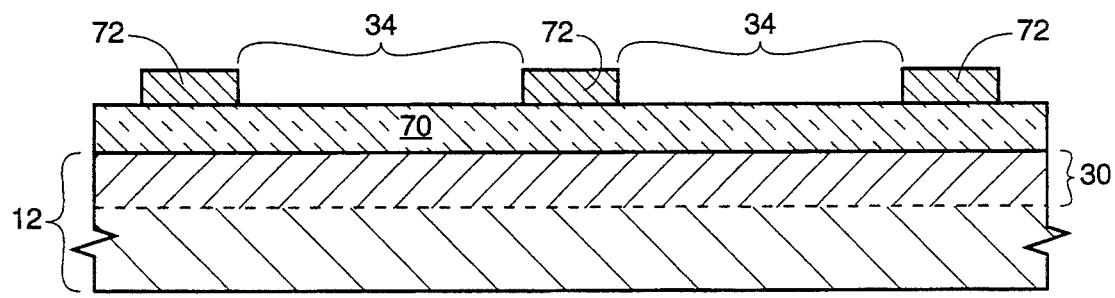
FIG. 7 is a cross section showing a first set of steps in a second embodiment of the inventive method of forming an asperity on the surface of a substrate, which includes boron doping, oxide layering, and resist patterning.
Figure 8:
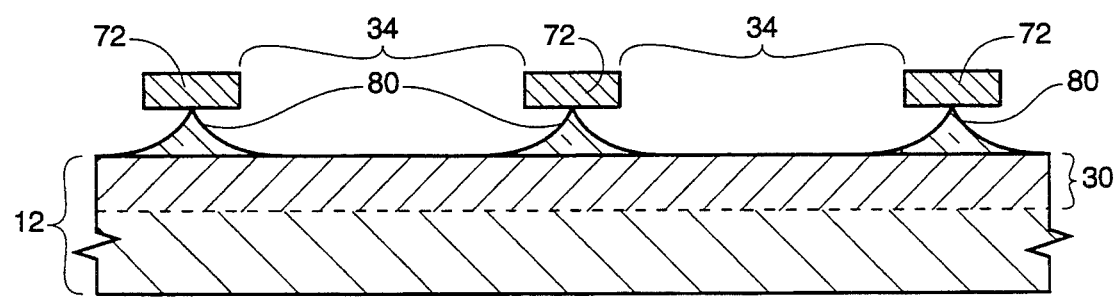
FIG. 8 is a cross section showing the undercutting of the oxide material beneath the resist resulting in concavely-shaped oxide structures.
Figure 9:
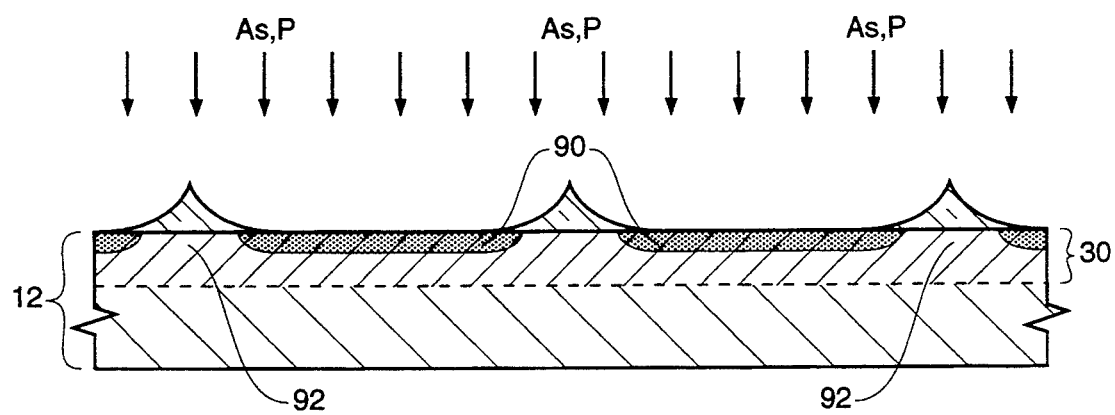
FIG. 9 is a cross section showing the implantation of N-type material through the oxide structures.

A second method of producing the gradient of boron concentrations in the surface of the substrate, shown in FIGS. 7–9, is to use a shaped mask on the surface of the substrate, then to dope the substrate through the mask. The resulting P-type conductivity in the substrate will be highest under the thickest part of the mask, as the N-type counterdopant does not penetrate the thickest part of the mask. The P-type conductivity is lowest under the thinnest part of the mask, as the boron is highly counterdoped. This embodiment has an increased number of steps over the previously described embodiment, but may have advantages.

Figure 1:
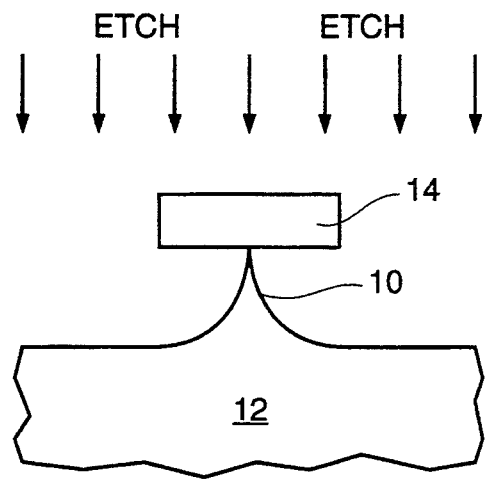
FIG. 1 is a cross section of a conventional method of forming an asperity on the surface of a substrate.
Figure 2:
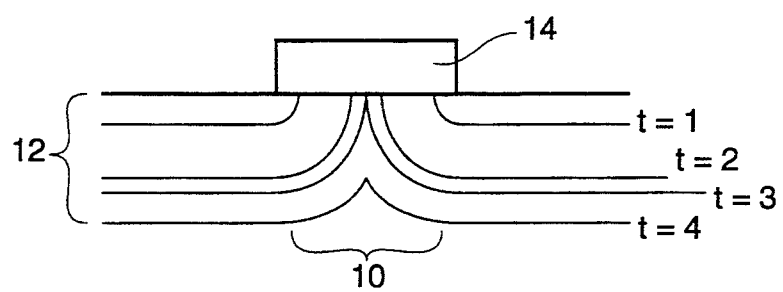
FIG. 2 is a cross section of a conventional method of forming an asperity which shows the variations which can occur in the asperity depending on the etch time.

The mask itself can be created by first forming a blanket layer of barrier material 70 such as oxide over the substrate 12, then patterning a resist material 72 over the barrier material 70. The resist material 72 is then formed into a plurality of discs. The diameter of the discs of resist 72, and the distance between the discs 34 is approximately twice the thickness of the barrier material 70. This structure is shown in FIG. 7. An isotropic wet etch is performed on the barrier material 70 by means known in the art such as with a buffered HF solution, or with a plasma etch or a fluorine containing gas. In any case, the barrier material is isotropically etched, thereby undercutting the resist 72 in a similar manner as described for FIG. 1. Although this technique has some of the control problems described with respect to FIG. 1, the second step of ion implantation, which may be combined with a subsequent diffusion, can be employed to correct deficiencies of the mask etch. The resulting structure is shown in FIG. 8. The exposed barrier material 80 is etched to (or close to) the substrate surface, while the barrier material 80 centered under the resist is only slightly etched or not etched. This shapes the barrier material 80 as shown.

After the mask 80 is formed, the photoresist material 72 is removed and portions 90 of the boron doped substrate 30 is counterdoped, preferably by ion implantation, through the mask 80 with N-type material as shown in FIG. 9. Areas of mask 80 through which the counterdopant passes are referred to as vias. The regions of boron doped substrate 30 covered by thin mask material are easily counterdoped 90, while the areas covered thick mask material 92 are not counterdoped, or doped to a low concentration of N-type material. The N-type material counteracts the boron doping, and therefore produces a region 90 which can be etched. The thick mask material prevents (or greatly reduces) the implantation of the N-type material, and therefore the areas 92 of boron doped substrate covered by the thick mask material have a high P-type concentration and are not easily etched.

Figure 6B:
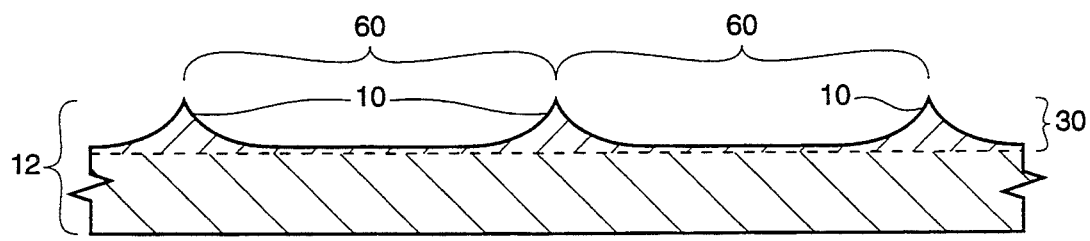
FIG. 6B is a cross section showing the remaining structure after the etch of FIG. 5.

Next, the mask material 80 is removed and the substrate areas having a high concentration of N-type material 90 are etched. After the etch, the structure of FIG. 6 remains.

The size and shape of the asperity can be altered by using a mask of a different dimension in the diameter and/or by changing the depth of the implant. During diffusion, the implant material typically moves two units horizontally for every three vertical units. If the depth of the implant is changed in the same proportions as the width of the mask, the size of the asperity will change but its proportions will remain the same.

Figure 10:
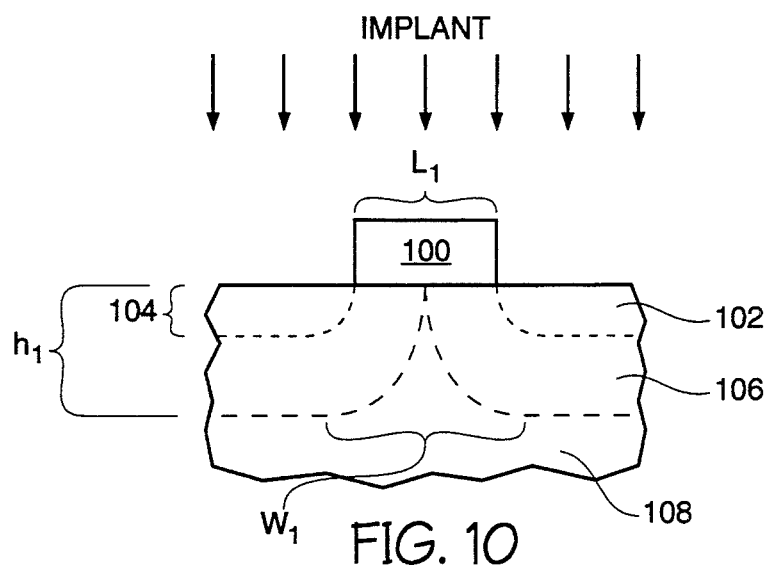
FIG. 10 shows a cross section of a first asperity formed by a mask having a specific width and an implantation of N-type to a specific depth.
Figure 11:
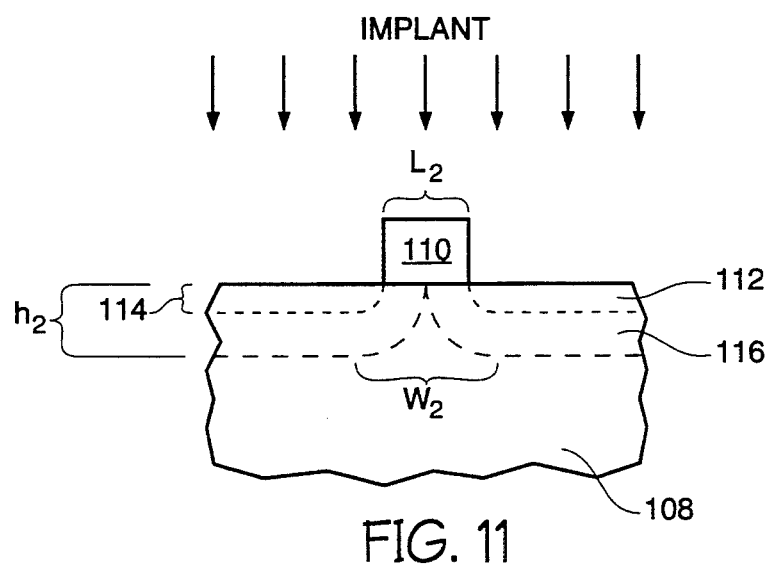
FIG. 11 shows a cross section of a second asperity formed by a narrower mask and a shallower implant than the structure of FIG. 10, but resulting in a structure proportional to the FIG. 10 structure.

FIG. 10 shows a mask 100 having a critical dimension $L_1$. A portion of the substrate 102 is counterdoped with an N-type dopant to a predetermined depth 104. The counterdopant is diffused 106 to a final depth $h_1$ within the boron doped substrate and to form what will become the asperity. The counterdoped substrate 102, 104 is easily etched, while the portion of the substrate having a high concentration of boron 108 is not etched. FIG. 11 shows a mask 110 which is narrower $L_2$ than the mask 100 of FIG. 10. The implant 112 reaches a predetermined depth 114. The implanted material is diffused deeper into the substrate 116 to a final depth $h_2$ within the boron doped substrate. This counterdoped area forms what will become the asperity. The depth of the implant 114 in FIG. 11, however, is not as deep as the FIG. 10 implant 104. As a result, the height/width ratio of the asperity of FIG. 10 ($h_1/w_1$) is equal to the height/width ratio of the asperity in FIG. 11 ($h_2/w_2$).

Figure 12:
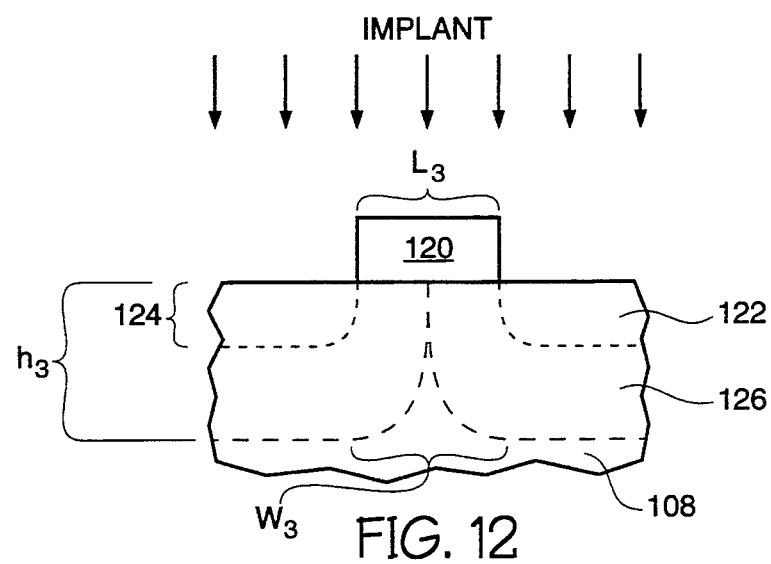
FIG. 12 shows a cross section of a third asperity formed by a mask identical to the mask of FIG. 10 but having a deeper implantation, thereby resulting in an asperity which is taller and narrower than the FIG. 10 asperity.

FIG. 12 shows a mask 120 having the same critical dimension $L_3$ as the mask 100 in FIG. 10, but the implanted material 122 is much deeper 124. During the diffusion of FIG. 12, the counterdopant diffuses deeper $h_3$ into the substrate than during the FIG. 10 diffusion $h_1$. After diffusion and an etch, a taller, narrower asperity remains. The height/width ratio of the asperity ($h_3/w_3$) of FIG. 12 is greater than the height/weight ratio of the asperity of FIGS. 10 ($h_1/w_1$) and 11 ($h_2/w_2$). By altering the proportions of the width of the mask and the depth of the implant, the height/width proportions of the asperity has been altered. This allows for greater control over the shape of the asperity.

Figure 13A:
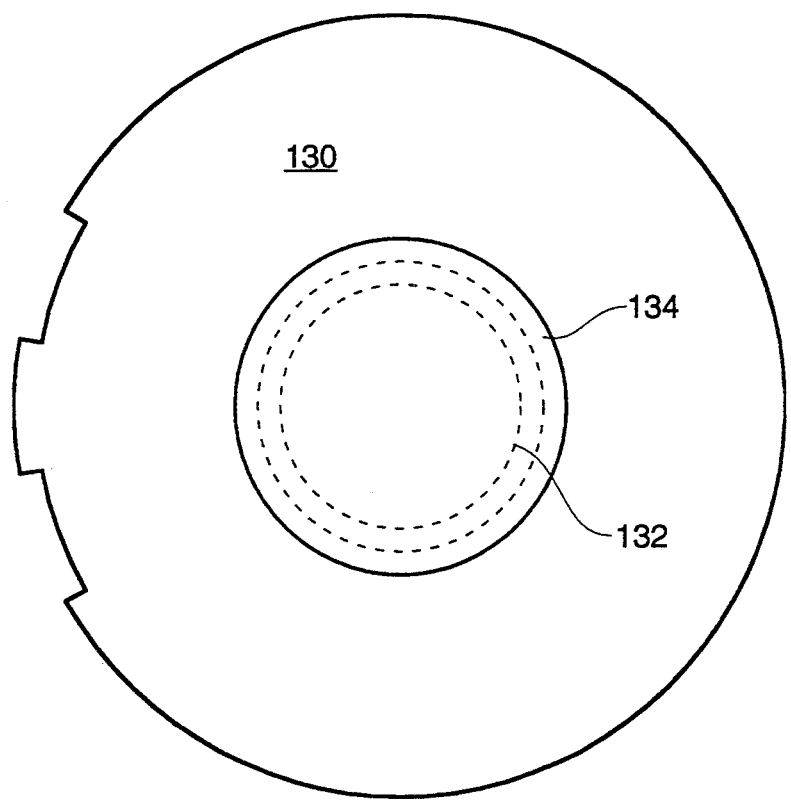
FIG. 13A shows a top view.
Figure 13B:
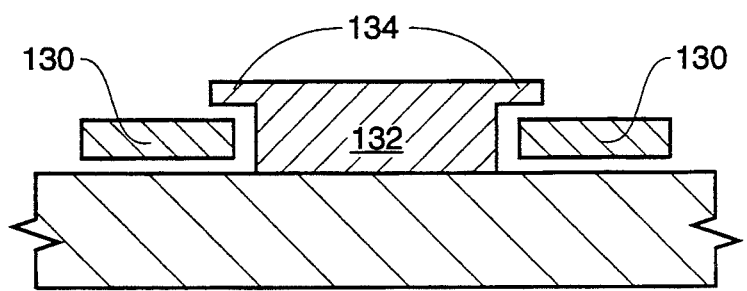
FIG. 13B shows a cross section, of a microgear which can be produced with the inventive method.

FIG. 13A shows a top view, and FIG. 13B shows a cross section, of a microgear 130 and axle 132 having a hub 134 which could be produced by the inventive process. FIGS. 14–18 describe a method for producing the microgear and axle of FIGS. 13A and 13B.

Figure 14:
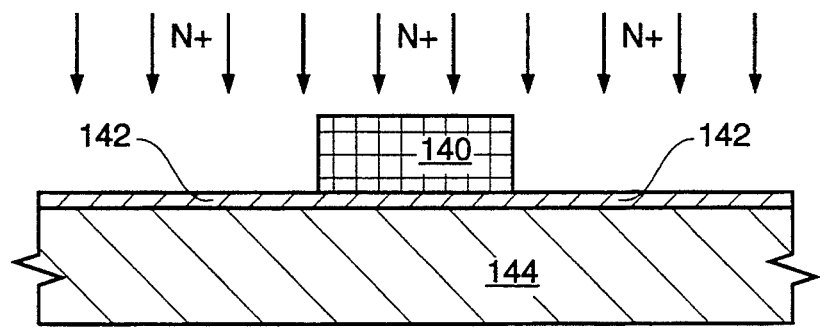
FIGS. 14–18 show a cross section of a method used to produce the microgear and axle of FIGS. 13A and 13B.

Referring to FIG. 14, a mask 140 defines the boundaries of a first layer of material 142 patterned over the substrate 144. The first layer 142 is implanted so as to have a low P-type conductivity.

Figure 15:
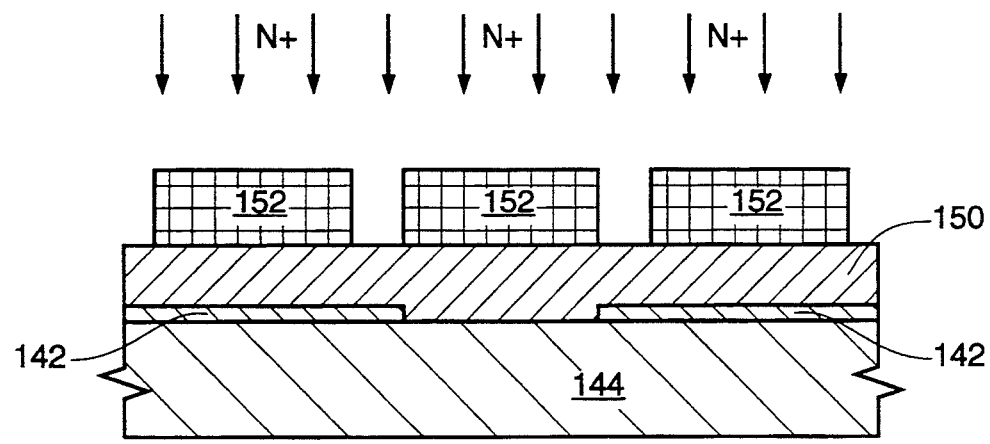

In FIG. 15, a planarized second layer 150 is blanket deposited over the first layer 142, and is implanted with boron to have a high P-type conductivity. A mask 152 protects the areas of the second layer 150 which will become the gear 130 and axle 132, and the exposed areas are implanted with N-type material to lower their P-type characteristics.

Figure 16:
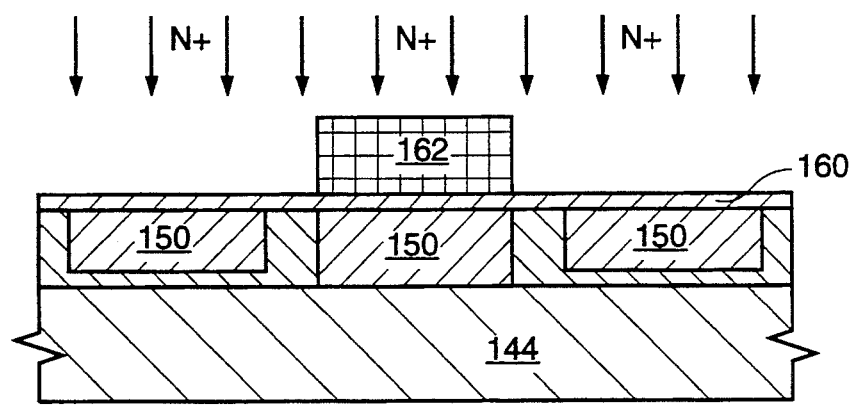

As shown in FIG. 16, the masks of FIG. 15 are removed and a planarized third layer 160 is defined by a mask 162 over the second layer 150. It is implanted with N-type dopant at low energy to produce the low P-type regions in 160. High P-type characteristics are maintained in 160 under the mask 162.

Figure 17:
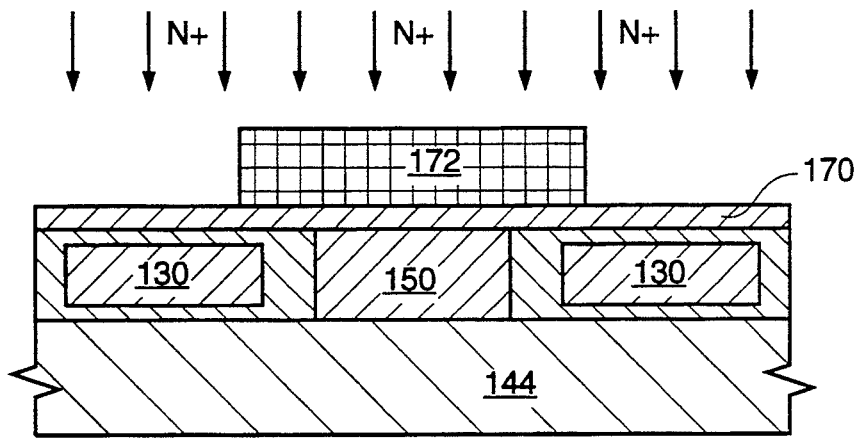
Figure 18:
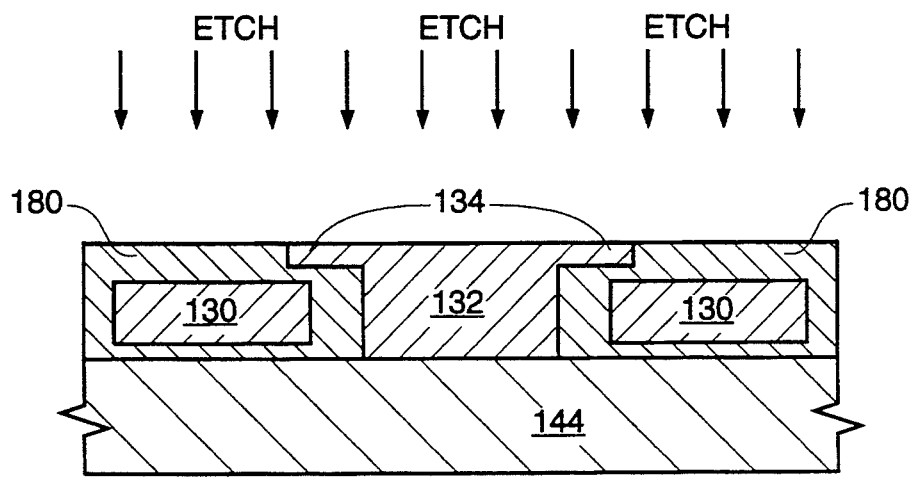

In FIG. 17, a P-type fourth layer 170 is patterned with a mask 172 and implanted with N-type material in the exposed areas. Finally, referring to FIG. 18, the areas having low P-type characteristics 180 are removed by means described previously to leave the structure of FIGS. 13A and 13B. Other processes for making this structure using the inventive method are possible and likely.

What has been described are specific configurations of the invention, as applied to particular embodiments. Clearly, variations can be made to the original designs described in this document for adapting the invention to other embodiments. As mentioned, P-type dopants other than boron, substrates other than silicon, N-type dopants other than phosphorous, antimony, or arsenic, and various etchants would also be sufficient. Different features can be produced with the inventive method. With regard to the asperity, for instance, the height and width of the can vary depending on the application. Therefore, the invention should be read as limited only by the appended claims.

We claim:

1. A method of etching an amount of material from a substrate, comprising the steps of:
    a) doping a surface of the substrate with a first-type dopant;
    b) forming a doping barrier on said surface of the substrate, said barrier having vias through which doping material can pass into said substrate;
    c) counterdoping first regions of the substrate with a second type dopant and leaving second regions of the substrate uncounterdoped;
    d) diffusing said second type dopant to form a three dimensional variation in first type and second type active doping concentrations of the substrate;
    e) etching the substrate using said first type active doping concentration as an etch stop, said etch removing said first regions of the substrate which are counterdoped above a first active doping concentration and leaving said uncounterdoped second regions and portions of said first regions of the substrate which are counterdoped below said first active doping concentration intact to form a feature from said uncounterdoped regions and from said first regions which are counterdoped below said first active doping concentration.

2. The method of claim 1 wherein said first type dopant is a P-type dopant and said second type dopant is an N-type dopant.

3. The method of claim 1 wherein said doping step dopes said substrate with a material comprising boron to a concentration greater than about $10^{20}$ boron/cm$^3$.

4. The method of claim 1 wherein said barrier is formed by photomasking a pattern of dopant resistive material over said substrate surface.

5. The method of claim 1 wherein said barrier forming step comprises the steps of:
    a) forming a blanket layer of mask material over said substrate;
    b) patterning a layer of photoresist over said mask material, said photoresist covering part of said mask material and leaving other parts of said mask material exposed;
    c) etching said exposed parts of said mask material, said etching undercutting said photoresist and forming a peak of mask material under said photoresist.

6. The method of claim 1 wherein said diffusing step forms a peak of material counterdoped below said first active doping concentration whereby said etching step results in a sharp point which protrudes from said substrate surface.

7. The method of claim 1 wherein said first type dopant is boron, and said first type active doping concentration of said uncounterdoped region is greater than about $10^{20}$ boron/cm$^3$, said first type active doping concentration of said second counterdoped region is less than about $10^{14}$ boron/cm$^3$, and said first type active doping concentration of said first counterdoped region is between about $10^{14}$ boron/cm$^3$ and $10^{20}$ boron/cm$^3$.

8. The method of claim 1, further comprising the step of removing said barrier prior to step e).

9. A method of etching an amount of material from a substrate, comprising the steps of:
    a) doping a surface of the substrate with a P-type dopant;
    b) forming a doping barrier on said surface of the substrate, said barrier having vias through which a dopant can pass into said substrate;
    c) counterdoping first regions of the substrate with an N-type dopant and leaving second regions of the substrate uncounterdoped;
    d) diffusing said N-type dopant to form a three dimensional variation in active N-type and P-type doping concentration in the substrate;
    e) etching the substrate using said active P-type doping concentration as an etch stop, said etch removing regions of the substrate which are doped with said N-type dopant above a first active doping concentration and leaving said uncounterdoped second regions and portions of said first regions which are doped with said N-type dopant below said first active doping concentration intact to form a feature from said uncounterdoped regions and from said first regions which are doped with said N-type dopant below said first active doping concentration.

10. The method of claim 9 wherein said doping step dopes said substrate with a dopant comprising boron to a concentration greater than about $10^{20}$ boron/cm$^3$.

11. The method of claim 9 wherein said barrier is formed by photomasking a pattern of dopant resistive material over said substrate surface.

12. The method of claim 9 wherein said barrier forming step comprises the steps of:
    a) forming a blanket layer of mask material over said substrate;

b) patterning a layer of photoresist over said mask material, said photoresist covering part of said mask material and leaving other parts of said mask material exposed;

c) etching said exposed parts of said mask material, said etching undercutting said photoresist and forming a peak of mask material under said photoresist.

13. The method of claim 9 wherein said diffusing step forms a peak of material doped below said first active N-type concentration whereby said etching step results in a sharp point which protrudes from said substrate surface.

14. The method of claim 9, further comprising the step of removing said doping barrier prior to step e).

15. A method of producing a substantially pointed feature from a substrate material, comprising the steps of:

a) doping the substrate with a P-type material;

b) forming a barrier on a surface of the substrate, said barrier having vias through which doping material can pass into said substrate;

c) counterdoping P-type first regions of the substrates with an N-type doping material and leaving second regions of said P-type substrate uncounterdoped;

d) diffusing said N-type doping material to form a substantially pointed uncounterdoped region, a first counterdoped region which is counterdoped more heavily than said uncounterdoped region, and a second counterdoped region which is counterdoped more heavily than said first counterdoped region;

e) etching the substrate using said first counterdoped region as an etch stop and etching said second counterdoped region of the substrate, thereby leaving said substantially pointed uncounterdoped region and a portion of said first counterdoped region to form the substantially pointed feature thereby.

16. The method of claim 15 wherein said doping step dopes said substrate with a material comprising boron to a concentration greater than about $10^{20}$ boron/cm$^3$.

17. The method of claim 16 wherein said uncounterdoped region has a high P-type conductivity and is not easily etched by an etchant, said second counterdoped region has a low P-type conductivity and is easily etched by said etchant, and said first counterdoped region has a P-type conductivity between said uncounterdoped region and said second counterdoped region and is marginally etched by said etchant.

18. The method of claim 17 wherein an active boron concentration of said uncounterdoped region is greater than about $10^{20}$ boron/cm$^3$, an active boron concentration of said second counterdoped region is less than about $10^{14}$ boron/cm$^3$, and an active boron concentration of said first counterdoped region is between about $10^{14}$ boron/cm$^3$ and $10^{20}$ boron/cm$^3$.

19. The method of claim 15 wherein said barrier is formed by photomasking a pattern of dopant resistive material over said substrate surface.

20. The method of claim 15 wherein said barrier forming step comprises the steps of:

a) forming a blanket layer of mask material over said substrate;

b) patterning a layer of photoresist over said mask material, said photoresist covering a portion of said mask material and leaving other portions of said mask material exposed;

c) etching said exposed portions of said mask material with an etching material, said etching material undercutting said photoresist and forming a peak of mask material under said photoresist.

21. The method of claim 15, further comprising the step of removing said barrier prior to step e).

22. The method of claim 17 wherein said etchant comprises KOH.

* * * * *